United States Patent [19]

Sanemitsu

[11] Patent Number: 5,600,543
[45] Date of Patent: Feb. 4, 1997

[54] IC CARD

[75] Inventor: Yoshikado Sanemitsu, Tokyo, Japan

[73] Assignee: Mitsubishi Denki Kabushiki Kaisha, Tokyo, Japan

[21] Appl. No.: 572,647

[22] Filed: Dec. 14, 1995

[30] Foreign Application Priority Data

Aug. 24, 1995 [JP] Japan .................................. 7-215762

[51] Int. Cl.⁶ ...................................................... H05K 1/14
[52] U.S. Cl. .......................... 361/737; 361/752; 257/679
[58] Field of Search .................................. 361/737, 728, 361/752, 796, 758, 759, 802; 257/679; 364/708; 235/492, 441; 439/44, 74; 206/328–331

[56] References Cited

U.S. PATENT DOCUMENTS

| 4,872,091 | 10/1989 | Maniwa et al. .......................... 361/424 |
| 5,299,940 | 4/1994 | Uenaka et al. . | |
| 5,313,364 | 5/1994 | Omori et al. . | |
| 5,335,145 | 8/1994 | Kusui ....................................... 361/737 |
| 5,375,040 | 12/1994 | Cooper et al. . | |

FOREIGN PATENT DOCUMENTS 0652695  11/1994  European Pat. Off. .

*Primary Examiner*—Leo P. Picard
*Assistant Examiner*—Y. Whang

[57] ABSTRACT

In an IC card made by the construction that fastens a connector housing to an open end of a U-shaped frame, fastens, to a face of the connector housing adjacent to the face into which external connector pins are inserted, a conductive metal member having at least one protrusion formed thereon and used for reducing the impedance of ground terminals, and holds the frame between a pair of metal panels, one of the metal panels has through-holes in its end at the connector housing for inserting the protrusions thereto to make them project therethrough, and the metal panel, in which the protrusions project through the holes, is fastened to the frame, while the metal panel holds the metal member between itself and the connector housing.

14 Claims, 5 Drawing Sheets

IC CARD

BACKGROUND OF THE INVENTION

1. Field of the Invention

The present invention relates to a construction of IC card.

2. Description of the Related Art

FIG. 6 shows a perspective view of a prior IC card, and FIG. 7 shows a sectional view along line a–a' of FIG. 6.

In FIGS. 6 and 7, the IC card 20 comprises an approximately U-shaped frame 1 made of resin or the like, metal panels 2a, 2b, a connector housing 3 made of plastic or the like, having sockets 6, into which various pins of an external system including power supply terminals, ground terminals, and signal conductors are inserted, and having socket leads 10, a reinforcing ground 4 consisting of a conductive metal member having at least one approximately semi-spherical protrusion 5 formed thereon and used for reducing the impedance of ground terminals, and a printed board 7 on which various devices are mounted.

The above connector housing 3 is fastened to frame 1 at its open end, and the reinforcing ground 4 is fastened to a face of connector housing 3 adjacent to the face into which external connector pins are inserted. The printed board 7 is fastened inside frame 1 to which the connector housing 3 is fastened, and each of socket leads 10 is connected to printed board 7. Further, frame 1 has a reinforcing portion 11 that bridges the opposite sides of frame 1 for reinforcement.

FIG. 8 is a perspective view of reinforcing ground 4. As seen from FIG. 8, reinforcing ground 4 has at least one connection lead 9, which is elongated approximately at the right angle to the plane portion 13 on which the protrusion 5 is formed in the direction opposite to the direction in which the protrusion 5 projects, and the end of each connection lead 9 is bent outward approximately in parallel to the plane portion 13. The end of each connection lead 9 is connected to the ground of printed board 7.

Metal panels 2a and 2b hold between themselves the frame 1 such that, as described above, connector housing 3 to which the reinforcing ground 4 is fastened is fastened to frame 1, printed board 7 is fastened inside frame 1, and each of connection leads 9 and socket leads 10 are connected to printed board 7. At this time, metal panel 2a is fastened to frame 1 in such a way as metal panel 2a does not contact reinforcing ground 4 so that the plane portion 13 having protrusions 5 of reinforcing ground 4 is exposed to the outside. Further, protrusions 5 of reinforcing ground 4 have sufficient height to stand above metal panel 2a and connector housing 3.

FIG. 9 shows the state in which the IC card 20 is inserted into a connector 19 of an external system equipment. In FIG. 9, connector 19 comprises connector pins 15, a connector body 16 made of resin or the like that fastens connector pins 15, a terminal 17 that connects the protrusions 5 of IC card 20 to itself by pressure contact. Terminal 17 is installed inside the slot, so that when connector pins 15 are inserted into corresponding sockets 6 of IC card 20, protrusions 5 contact terminal 17. The other end of terminal 17 is connected to a printed board 18 of the system equipment. In this way reinforcing ground 4 is used for reducing the impedance of the ground terminals in connector pins 15.

However, in an IC card having the above construction, metal panel 2a is fastened only to the U-shaped frame 1 and does not touch connector housing 3 or reinforcing ground 4, so that the corresponding part of metal panel 2a is kept loose without being supported by anything. Consequently, the part of metal panel 2a has little strength and easily broken if it is stressed. For example, if forces are applied to IC card 20 from the side of metal panel 2b, then the weak part of metal panel 2a warps outside. Therefore, there has been a problem that metal panel 2a is deformed in such a manner.

SUMMARY OF THE INVENTION

The object of the present invention is therefore to solve the above problem and more particularly to obtain an IC card such that the strength of the metal panel is reinforced, while the reinforcing ground is installed.

In the kind of IC card made by the construction that fastens a connector housing to the open end of a U-shaped frame, fastens, to a face of the connector housing adjacent to the face into which external connector pins are inserted, a conductive metal member having at least one protrusion formed thereon and used for reducing the impedance of ground terminals, and holds the frame between a pair of metal panels, the present invention provides an IC card characterized by the following facts:

One of the metal panels has through-holes in its end at the connector housing for inserting the protrusions thereto to let them project therethrough. The metal panel, in which the protrusions project through the holes, is fastened to the frame and holds the metal member between itself and the connector housing.

According to one aspect of the above IC card, the total number of the holes is the same as the total number of the protrusions, and each protrusion is inserted to each hole to project through the hole.

According to another aspect of the above IC card, a plurality of the protrusions can be inserted into each of the holes to project therethrough.

In the kind of IC card made by the construction that fastens a connector housing to the open end of a U-shaped frame, fastens, to a face of the connector housing adjacent to the face into which external connector pins are inserted, a conductive metal member having at least one protrusion formed thereon and used for reducing the impedance of ground terminals, and holds the frame between a pair of metal panels, the present invention provides another IC card characterized by the following facts:

One of the metal panels has cuts in its edge at the connector housing for fitting the protrusions therein to let them project therethrough. The metal panel, in which the protrusions project through the cuts, is fastened to the frame and holds the metal member between itself and the connector housing.

According to one aspect of the present invention, in the above IC card, an insulating material is applied between the metal member and the one of metal panels so that they are insulated from each other. Then the metal panel is fastened to the metal member through the insulating material.

According to another aspect of the present invention, the insulating material in the above IC card is formed by applying an insulating material to the part of the metal panel that contacts the metal member.

According to another aspect of the present invention, the insulating material in the above IC card is at the same time an adhesive, which glues the metal panel to the metal member.

According to another aspect of the present invention, the insulating material in the above IC card is double-sided adhesive tape made from an insulating material, so that the metal panel is fastened to the metal member with the double-sided adhesive tape.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

The preferred embodiments according to the present invention will be described below with reference to the attached drawings.

Figure 1:
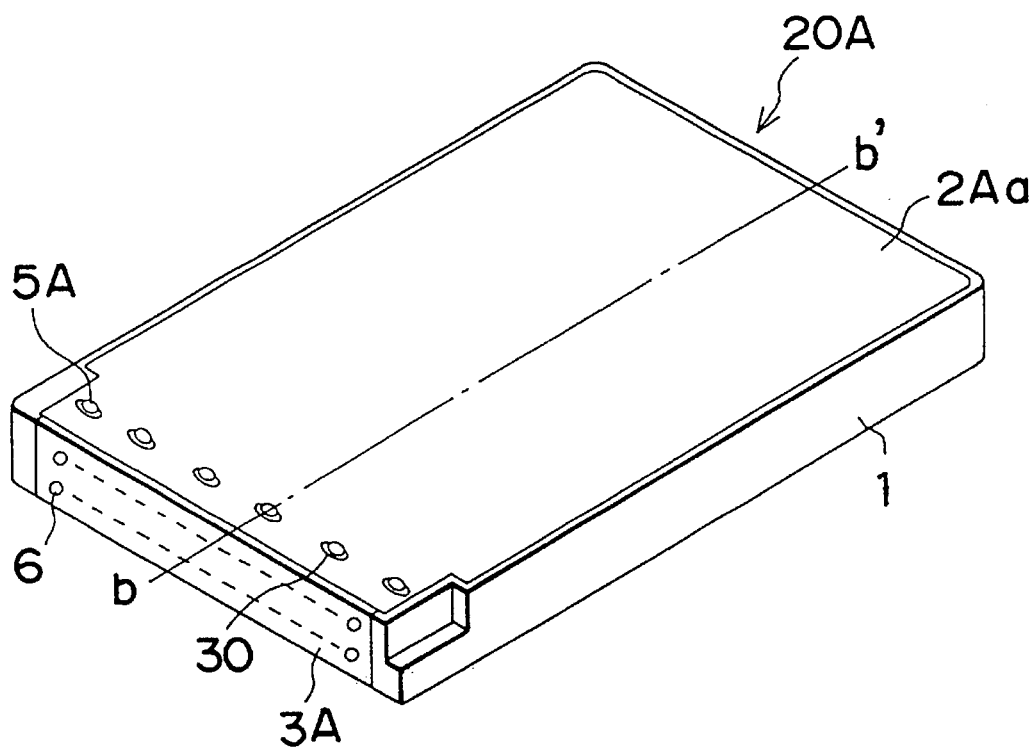
FIG. 1 is a perspective view of the IC card of a first embodiment in accordance with the present invention.
Figure 2:
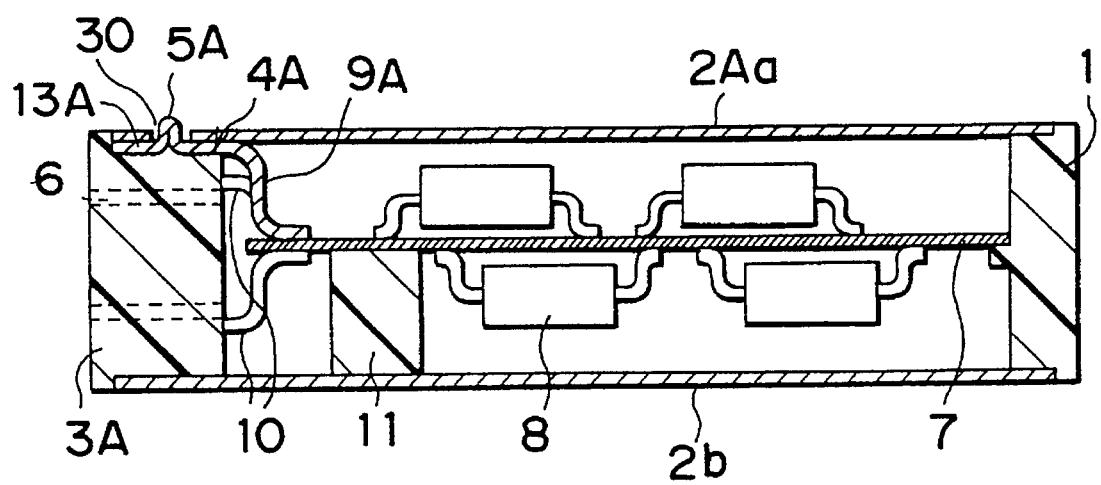
FIG. 2 is a cross-sectional view along line b–b' of FIG. 1.
Figure 6:
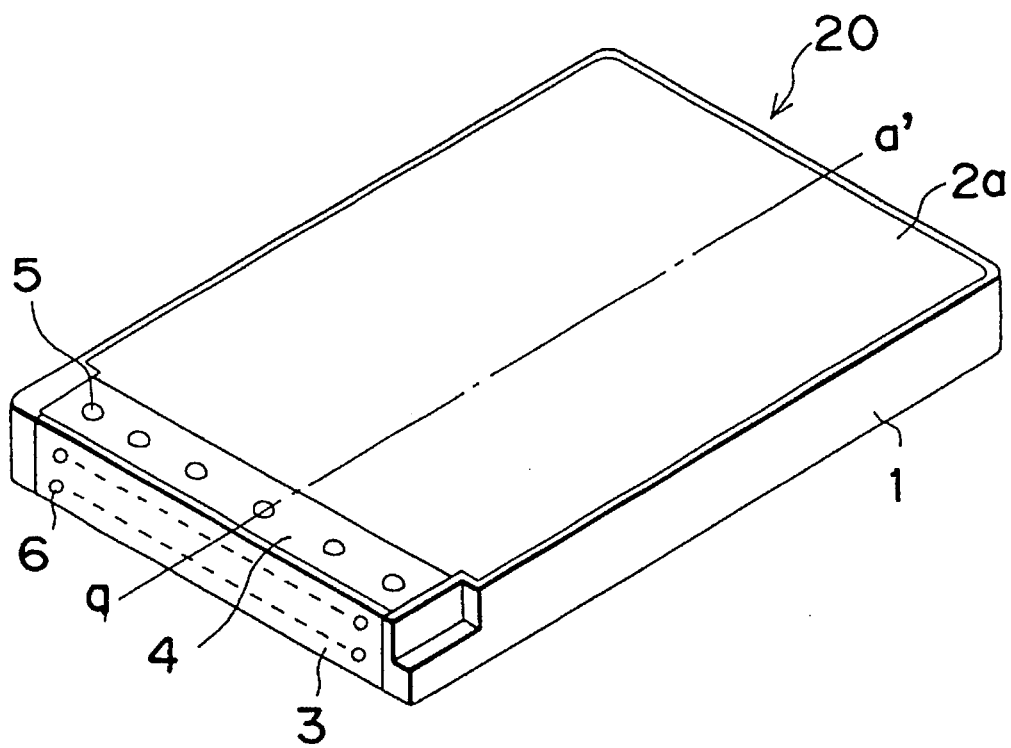
FIG. 6 is a perspective view of a prior IC card.
Figure 7:
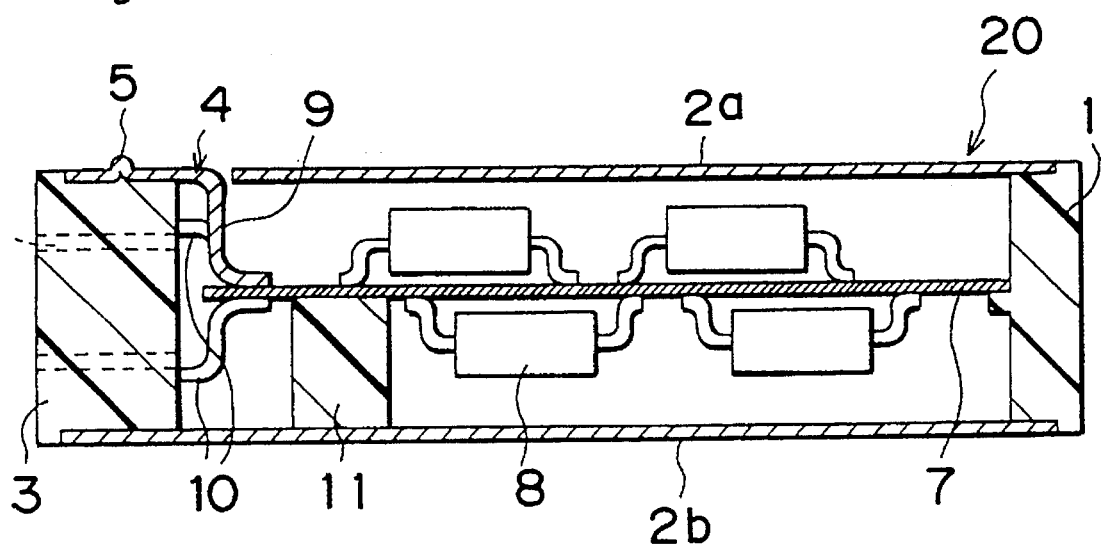
FIG. 7 is a cross-sectional view along line a–a' of FIG. 6.

FIG. 1 is a perspective view of the IC card of a first embodiment in accordance with the present invention, and FIG. 2 is a cross-sectional view along line b–b' of FIG. 1. The same components as in FIGS. 6 and 7 are denoted by the same symbols.

In FIGS. 1 and 2, the IC card 20A comprises an approximately U-shaped frame 1 made of resin or the like, metal panels 2Aa, 2b, a connector housing 3A made of resin or the like, having sockets 6 into which various pins of an external system including power supply terminals, ground terminals, and signal conductors are inserted, and having socket leads 10, a reinforcing ground 4A consisting in a conductive metal member having at least one approximately semi-spherical protrusion 5A formed thereon and used for reducing the impedance of ground terminals, and a printed board 7 on which various devices are mounted.

The above connector housing 3A is fastened to frame 1 at its open end, and the reinforcing ground 4A is fastened to a face of connector housing 3A adjacent to the face into which external connector pins are inserted. The printed board is fastened inside frame 1 to which the connector housing 3A is fastened, and each of socket leads 10 is connected to printed board 7. Further, frame 1 has a reinforcing portion 11 that bridges the opposite sides of frame 1 for reinforcement.

Figure 8:
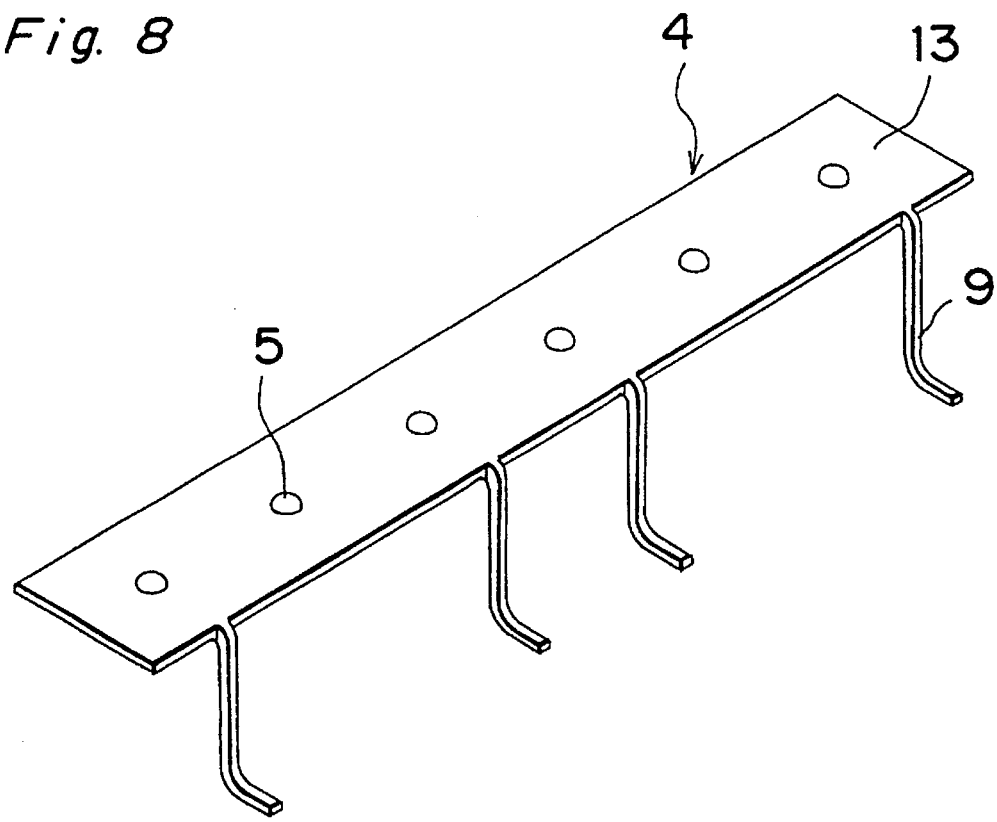
FIG. 8 is a perspective view of a reinforcing ground 4 shown in FIG. 7.
Figure 9:
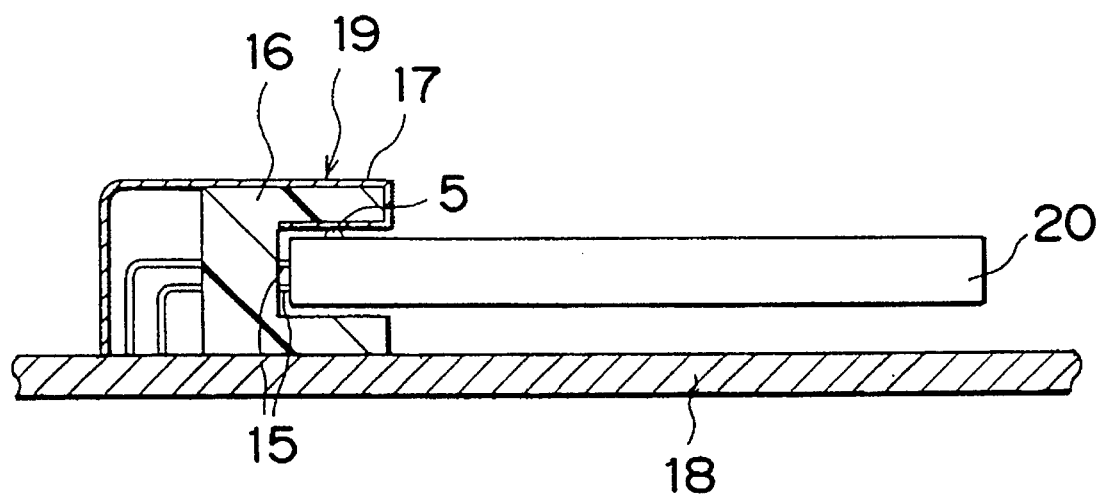
FIG. 9 is a cross-sectional view of a connector of an external system equipment into which an IC card has been inserted.

As the reinforcing ground 4 shown in FIG. 8, reinforcing ground 4A has at least one connection lead 9A, which is elongated approximately at the right angle to the plane portion 13A on which the protrusion 5A is formed in the direction opposite to the direction in which the protrusion 5A projects, and the end of each connection lead 9A is bent outward approximately in parallel to the plane portion 13A. As shown in FIG. 2, the end of each connection lead 9A is connected to the ground of printed board 7.

In this way, connector housing 3A to which the reinforcing ground 4A is fastened is fastened to frame 1, and printed board 7 is fastened inside frame 1, and each of connection leads 9A and socket leads 10 are connected to printed board 7. Metal panel 2Aa has through-holes 30, corresponding to protrusions 5A, formed along one short edge of connector housing 3A for inserting each protrusion 5A into each through-hole to let the former project through the latter. Metal panel 2Aa in which the protrusions 5A project through through-holes 30 is fastened to frame 1 and the reinforcing ground 4A, which has been fastened to connector housing 3A, and reinforcing ground 4A is held between metal panel 2Aa and connector housing 3A. Metal panel 2b is fastened to frame 1 and connector housing 3A at their side opposite to the side to which the metal panel 2Aa is fastened.

In short, metal panels 2Aa and 2b hold between themselves the frame 1 such that connector housing 3A to which the reinforcing ground 4A is fastened is fastened to frame 1, and printed board 7 is fastened inside frame 1, and each of connection leads 9A and socket leads 10 are connected to printed board 7. Also, protrusions 5A of reinforcing ground 4A have sufficient height to stand above metal panel 2Aa. Further, in order to protect various devices 8 mounted on IC card 20A from outside static electricity, the inside surfaces of metal panels 2Aa and 2b in IC card 20A are coated with an insulating varnish made from an insulating material, by which the metal panel 2Aa and reinforcing ground 4A are insulated from each other.

As described above, in the IC card of the first embodiment, the present invention fastens metal panel 2Aa to frame 1 and the reinforcing ground 4A fastened to connector housing 3A, while inserting each protrusion 5A into each through-hole 30 to let the protrusion 5A project through the through-hole 30, so that reinforcing ground 4A is firmly held between metal panel 2Aa and connector housing 3A. Consequently, the present invention obviates the problem that, in a prior IC card, the metal panel is fastened only to the U-shaped frame and does not touch the connector housing or the reinforcing ground, so that the corresponding part of the metal panel is kept loose without being supported by anything. Particularly, the present embodiment enlarges the mechanical strength of the corresponding part of metal panel 2Aa against stress. Further, since the inside surface of metal panel 2Aa is coated with an insulating material, metal panel 2Aa and reinforcing ground 4A are insulated from each other, so that various devices built into the IC card are protected from outside static electricity.

In the IC card of the first embodiment, the total number of through-holes 30 of metal panel 2Aa is the same as the total number of protrusions 5A, each of which projects through each of through-holes 30. However, a plurality of protrusions can be made to project through one through-hole. The IC card of a second embodiment in accordance with the present invention is made in this way.

Figure 3:
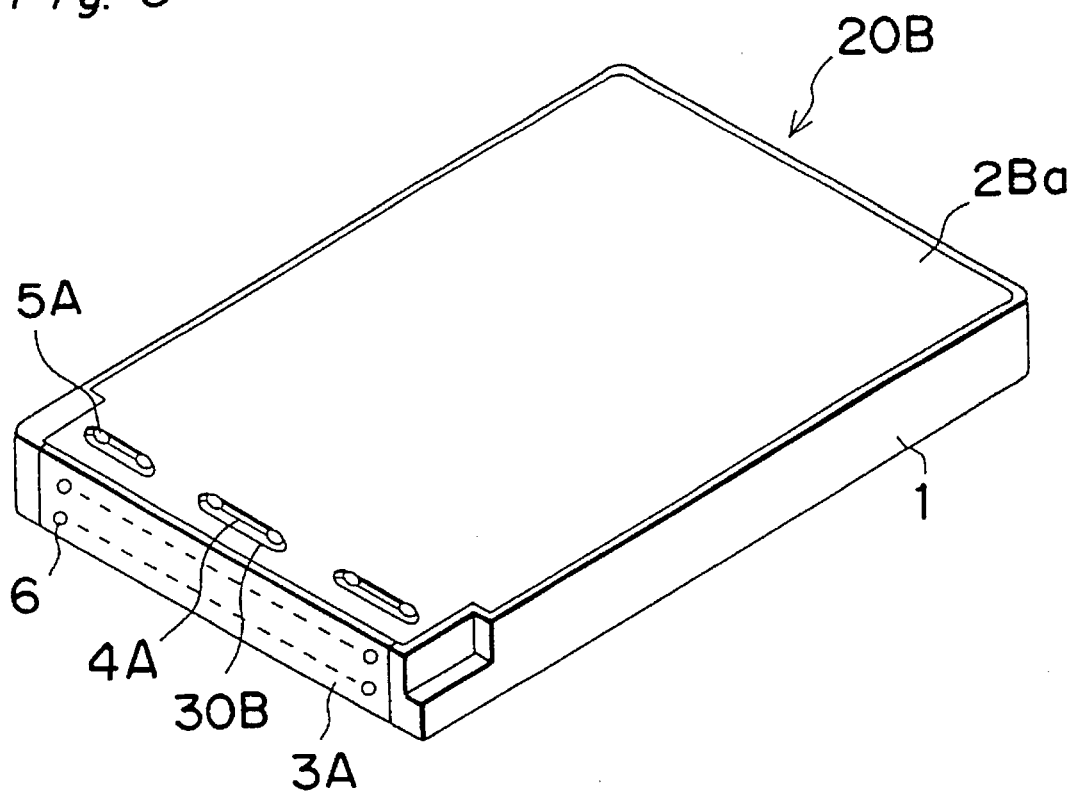
FIG. 3 is a perspective view of the IC card of a second embodiment in accordance with the present invention.

FIG. 3 is a perspective view of the IC card of the second embodiment in accordance with the present invention. The same components as in FIG. 1 are denoted by the same symbols, their descriptions are omitted here, and those which are different from components in FIG. 1 are described in the following.

FIG. 3 is different from FIG. 1 in that the shape of the through-holes 30 of metal panel 2Aa in FIG. 1 is altered, so that a plurality of protrusions 5A on reinforcing ground 4A can be inserted thereto. In keeping with this alteration, the through-holes are now denoted by 30B, the metal panel corresponding to metal panel 2Aa is denoted by 2Ba, and the new IC card is denoted by 20B.

In FIG. 3, metal panel 2Ba has through-holes 30B, corresponding to protrusions 5A, in its end at connector hosing 3A for inserting two protrusions 5A into each through-hole 30B to let the former project through the latter. Metal panel 2Ba in which the protrusions 5A project through through-holes 30B is fastened to frame 1 and the reinforcing ground 4A, which has been fastened to connector housing 3A, and reinforcing ground 4A is held between metal panel 2Ba and connector housing 3A.

In FIG. 3, each through-hole 30B has two protrusions 5A inserted into itself, but, in general, each through-hole has a shape that allows a plurality of protrusions to be inserted thereto. Further, in order to protect various devices 8 of IC card 20B from outside static electricity, the inside surfaces of metal panels 2Ba and 2b in IC card 20B are coated with an insulating varnish made from an insulating material, by which the metal panel 2Ba and the reinforcing ground 4A are insulated from each other.

As described above, in the IC card of the second embodiment, the present invention fastens metal panel 2Ba to frame 1 and the reinforcing ground 4A fastened to connector housing 3A, while inserting a plurality of protrusions 5A into each through-hole 30B to let the protrusions 5A project through it, so that reinforcing ground 4A is firmly held between metal panel 2Ba and connector housing 3A. Consequently, the present invention obviates the problem that, in a prior IC card, the metal panel is fastened only to the U-shaped frame and does not touch the connector housing or the reinforcing ground, so that the corresponding part of the metal panel is kept loose without being supported by anything. Particularly, the present embodiment enlarges the mechanical strength of the corresponding part of metal panel 2Ba against stress. Further, since the inside surface of metal panel 2Ba is coated with an insulating material, metal panel 2Ba and reinforcing ground 4A are insulated from each other, so that various devices built into the IC card are protected from outside static electricity.

In the IC card of the first embodiment, the total number of through-holes 30 of metal panel 2Aa is the same as the total number of protrusions 5A, each of which projects through each of through-holes 30. However, through-holes 30 can be replaced with cuts in the edge of metal panel 2Aa to fit protrusions 5A therein to let them project through the cuts. The IC card of a third embodiment in accordance with the present invention is made in this way.

Figure 4:
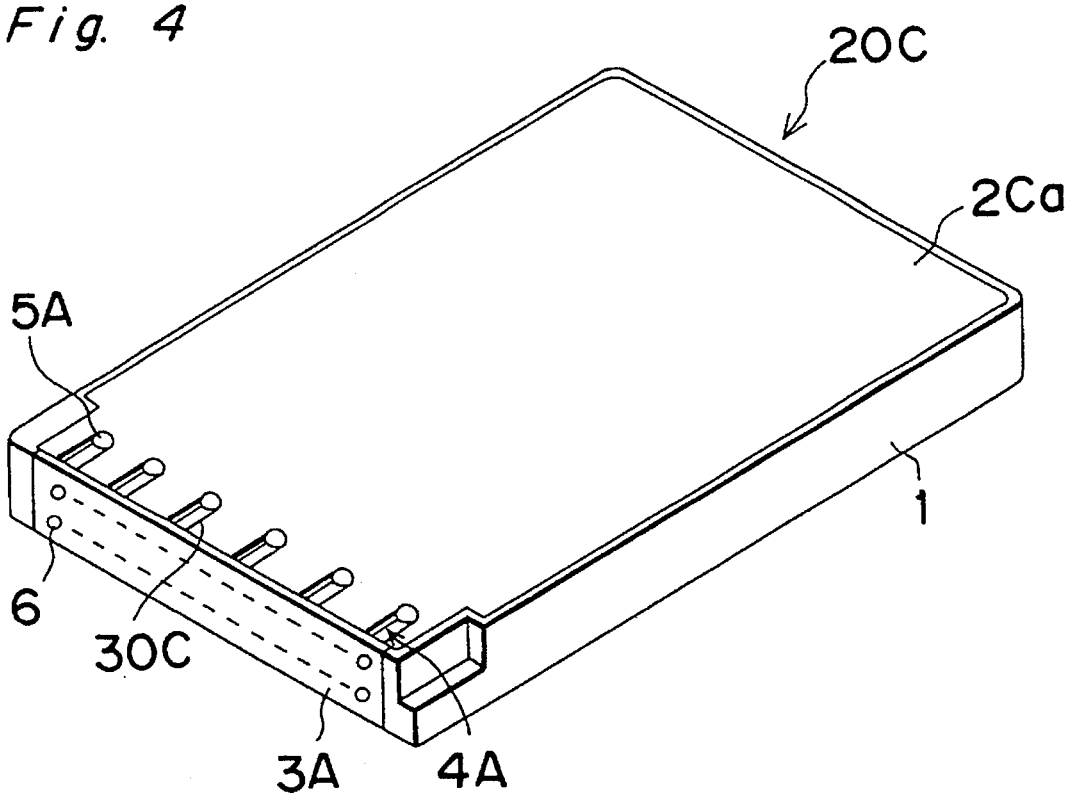
FIG. 4 is a perspective view of the IC card of a third embodiment in accordance with the present invention.

FIG. 4 is a perspective view of the IC card of the third embodiment in accordance with the present invention. The same components as in FIG. 1 are denoted by the same symbols, their descriptions are omitted here, and only those which are different from components in FIG. 1 are described in the following.

FIG. 4 is different from FIG. 1 in that the through-holes 30 of metal panel 2Aa in FIG. 1 is replaced by approximately U-shaped cuts 30C formed by cutting the edge of metal panel 2Aa at connector housing 3A, so that each protrusion 5A can fit in and project through each cut 30C. In keeping with this alteration, the metal panel corresponding to metal panel 2Aa is now denoted by 2Ca, and the new IC card is denoted by 20C.

In FIG. 4, metal panel 2Ca has approximately U-shaped cuts 30C, corresponding to protrusions 5A, formed by cutting the edge of metal panel 2Ca at connector housing 3A, for fitting each protrusion 5A into each cut 30C to let the protrusion project through the cut. Metal panel 2Ca in which the protrusions 5A project through cuts 30C is fastened to frame 1 and the reinforcing ground 4A, which has been fastened to connector housing 3A, and reinforcing ground 4A is held between metal panel 2Ca and connector housing 3A.

In FIG. 4, cuts 30C are made to be approximately U-shaped. However, cuts 30C can be shaped more generally to fit protrusions therein. Further, as in the first embodiment, in order to protect various devices 8 built into IC card 20C from outside static electricity, the inside surfaces of metal panels 2Ca and 2b in IC card 20C are coated with an insulating varnish made from an insulating material, by which the metal panel 2Ca and reinforcing ground 4A are insulated from each other.

As described above, in the IC card of the third embodiment, the present invention fastens metal panel 2Ca to frame 1 and the reinforcing ground 4A fastened to connector housing 3A, while fitting each protrusion 5A in each cut 30C to let the protrusion 5A project through the cut 30, so that reinforcing ground 4A is firmly held between metal panel 2Ca and connector housing 3A. Consequently, the present invention obviates the problem that, in a prior IC card, the metal panel is fastened only to the U-shaped frame and does not touch the connector housing or the reinforcing ground, so that the corresponding part of the metal panel is kept loose without being supported by anything. Particularly, the present embodiment enlarges the mechanical strength of the corresponding part of metal panel 2Ca against stress. Further, since the inside surface of metal panel 2Ca is coated with an insulating material, metal panel 2Ca and reinforcing ground 4A are insulated from each other, so that various devices built into the IC card are protected from outside static electricity.

In the above first, second and third embodiments, in order to protect various devices of the IC card from outside static electricity, the inside surface of a metal panel is coated with an insulating varnish made from an insulating material, by which the metal panel and the reinforcing ground are insulated from each other.

However, the thickness of the insulating varnish is small, so that if the part of a metal panel fastened to the reinforcing ground is flawed, and the insulating varnish thereon is scraped off, then defective insulation or deterioration in dielectric strength between the metal panel and the reinforcing ground may occur. Therefore, the IC card of a fourth embodiment is made by adhering the metal panel to the reinforcing ground using an adhesive made from an insulating material.

Figure 5:
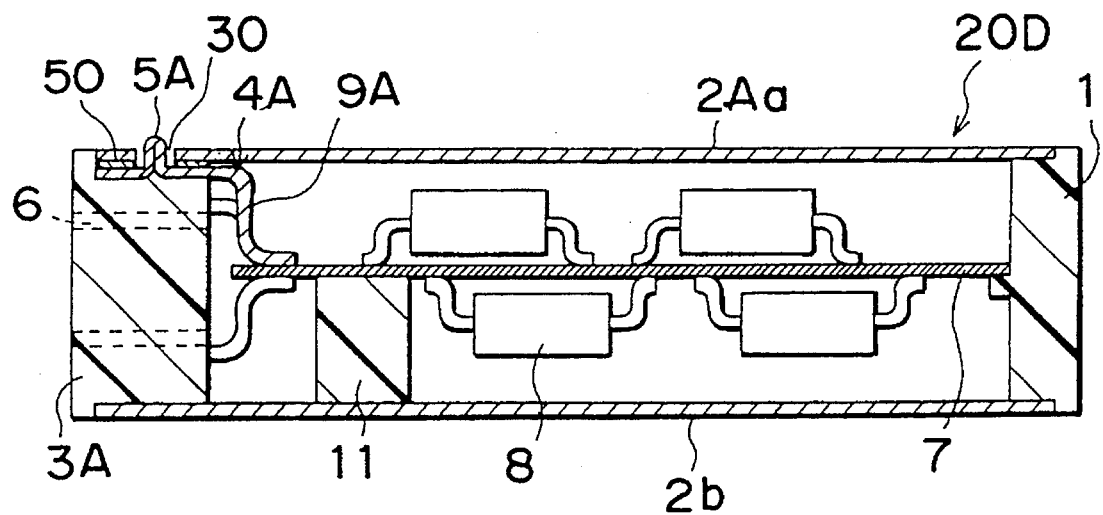
FIG. 5 is a cross-sectional view of the IC card of a fourth embodiment in accordance with the present invention.

FIG. 5 is a cross-sectional view of the IC card of the fourth embodiment in accordance with the present invention. The same components as in FIG. 2 are denoted by the same symbols, and their descriptions are omitted here, and only those which are different from components in FIG. 2 are described in the following.

FIG. 5 is different from FIG. 2 in that the metal panel 2Aa is fastened to reinforcing ground 4A using an adhesive 50. In keeping with this alteration, the IC card 20A is now denoted by IC card 20D.

In FIG. 5, metal panel 2Aa has through-holes 30, corresponding to protrusions 5A, in its end at connector housing 3A for inserting each protrusion 5A into each through-hole to let the former project through the latter. Metal panel 2Aa in which the protrusions 5A project through through-holes 30 is fastened to frame 1 and the reinforcing ground 4A, which has been fastened to connector housing 3A, and reinforcing ground 4A is held between metal panel 2Aa and connector housing 3A. At this time, metal panel 2Aa is fastened to reinforcing ground 4A with adhesive 50.

As described above, in the IC card of the fourth embodiment, the present invention obviates the problem that, in a prior IC card, the metal panel is fastened only to the U-shaped frame and does not touch the connector housing or the reinforcing ground, so that the corresponding part of the metal panel is kept loose without being supported by anything. Particularly, the present embodiment enlarges the mechanical strength of the corresponding part of metal panel 2Aa against stress, secures the insulation between metal panel 2Aa and reinforcing ground 4A, and increases the dielectric strength.

In the IC card of the fourth embodiment, the metal panel 2Aa is fastened to the reinforcing ground 4A with the adhesive 50. However, in applying adhesive 50 between metal panel 2Aa and reinforcing ground 4A, it is possible that the fourth embodiment can not uniformly apply the adhesive, so that dispersion in the dielectric strength might occur. The IC card of a fifth embodiment in accordance with the present invention is made by adhering metal panel 2Aa to reinforcing ground 4A with double-sided adhesive tape.

Since the IC card of the fifth embodiment is different from the IC card of the fourth embodiment shown in FIG. 5 in that adhesive 50 is replaced with double-sided adhesive tape 60, and the new IC card is denoted by 20E, IC card 20E is described in the following with reference to FIG. 5.

The IC card 20E of the fifth embodiment in accordance with the present invention is made by replacing adhesive 50 in FIG. 5 with double-sided adhesive tape 60. Metal panel 2Aa has through-holes 30, corresponding to protrusions 5A, in its end at connector housing 3A for inserting each protrusion 5A into each through-hole to let the former project through the latter. Metal panel 2Aa in which the protrusions 5A project through through-holes 30 is fastened to frame 1 and the reinforcing ground 4A, which has been fastened to connector housing 3A, and reinforcing ground 4A is held between metal panel 2Aa and connector housing 3A. At this time, metal panel 2Aa is fastened to reinforcing ground 4A with double-side adhesive tape 60 made from an insulating material.

As described above, in the IC card of the fifth embodiment the present invention obviates the problem that, in a prior IC card, the metal panel is fastened only to the U-shaped frame and does not touch the connector housing or the reinforcing ground, so that the corresponding part of the metal panel is kept loose without being supported by anything. Particularly, the present embodiment enlarges the mechanical strength of the corresponding part of metal panel 2Aa against stress, secures the insulation between metal panel 2Aa and the reinforcing ground, and increases the dielectric strength.

The IC cards of the above fourth and fifth embodiments have been made by modifying the above first embodiment. However, the same modifications can be made for the second and third embodiments. In this way, the present invention allows various variations. It is apparent that such changes and modifications are within the scope of the present invention as defined by the claims.

As is clear from the above descriptions, according to an IC card of the present invention, one of the metal panels has through-holes in its end at the connector housing, corresponding to protrusions on the metal member, for inserting the protrusions thereto to let them project therethrough. The metal panel in which the protrusions project through the holes is fastened to the frame, while the metal panel holds the metal member between itself and the connector housing. Consequently, the present invention obviates the problem that, in a prior IC card, the metal panel is fastened only to the U-shaped frame and does not touch the connector housing or the reinforcing ground, so that the corresponding part of the metal panel is kept loose without being supported by anything. Particularly, the mechanical strength of the corresponding part of the metal panel against stress is enlarged, so that the mechanical strength of the IC card is enlarged.

Further, according to another aspect of the present invention, one of the metal panels of the present invention has cuts in its edge at the connector housing, corresponding to the protrusions on the metal member, for fitting the protrusions therein to let them project therethrough. The metal panel in which the protrusions project through the cuts is fastened to the frame, while the metal panel holds the metal member between itself and the connector housing. Consequently, the present invention obviates the problem that, in a prior IC card, the metal panel is fastened only to the U-shaped frame and does not touch the connector housing or the reinforcing ground, so that the corresponding part of the metal panel is kept loose without being supported by anything. Particularly, the mechanical strength of the corresponding part of the metal panel against stress is enlarged, so that the mechanical strength of the IC card is enlarged.

Further, according to another aspect of the present invention, the part of the metal panel that contacts the metal member is coated with an insulating material, through which the metal panel is fastened to the metal member, so that the metal panel and the reinforcing ground are insulated from each other, and hence various devices built into the IC card are protected from outside static electricity.

Still further, according to another aspect of the present invention, an adhesive which is at the same time an insulating material can be used for the above insulating material, so that not only the metal panel and the metal member are fastened together, but also defective insulation, which may occur by enlarging the mechanical strength by the above means, can be prevented, and dielectric strength between the metal panel and the metal member can be enlarged. Consequently, various devices built into the IC card are protected from outside static electricity.

Still further, according to another aspect of the present invention, double-sided adhesive tape is used in place of the above adhesive, so that not only the metal panel and the metal member are fastened together, but also defective insulation, which may occur by enlarging the mechanical strength by the above means, can be prevented, dispersion in the dielectric strength between the metal panel and the metal member, caused by uneven application of the adhesive, can be prevented, and the dielectric strength can be enlarged. Consequently, various devices built into the IC card are protected from outside static electricity.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An IC card comprising:

an approximately U-shaped frame, a connector housing fastened to an open end of said frame, a metal member fastened to a face of said connector housing adjacent to the face into which connector pins are inserted, said metal member being made of a conductive metal plate, having at least one protrusion, and being used for reducing the impedance of earth terminals, and a pair of metal panels holding between themselves said frame to which said connector housing is fastened, wherein one of said metal panels has through-holes in its end at said connector housing for inserting said protrusions thereto to make them project therethrough, and said one of metal panels, in which said protrusions project through said through-holes, is fastened to said frame, while said one of metal panels holds said metal member between itself and said connector housing.

2. The IC card defined in claim 1 wherein the total number of said through-holes is the same as the total number of said protrusions.

3. The IC card defined in claim 2 wherein an insulating material is applied between said metal member and said one of metal panels so that they are insulated from each other.

4. The IC card defined in claim 1 wherein a plurality of said protrusions can be inserted into each of said through-holes to project therethrough.

5. The IC defined in claim 4 wherein an insulating material is applied between said metal member and said one of metal panels so that they are insulated from each other.

6. The IC card defined in claim 1 wherein an insulating material is applied between said metal member and said one of metal panels so that they are insulated from each other.

7. The IC card defined in claim 6 wherein said insulating material is formed by applying an insulating material to the part of said metal panel that contacts said metal member.

8. The IC card defined in claim 6 wherein said insulating material is at the same time an adhesive that glues said one of metal panels to said metal member.

9. The IC card defined in claim 6 wherein said insulating material is double-sided adhesive tape made from an insulating material.

10. An IC card comprising:

an approximately U-shaped frame, a connector housing fastened to the open end of said frame, a metal member fastened to a face of said connector housing adjacent to the face into which connector pins are inserted, said metal member being made of a conductive metal plate, having at least one protrusion, and being used for reducing the impedance of earth terminals, and a pair of metal panels holding between themselves said frame to which said connector housing is fastened, wherein one of said metal panels has cuts in its edge at said connector housing for fitting said protrusions therein to let them project therethrough, and said one of metal panels, in which said protrusions project through said cuts, is fastened to said frame, while said one of metal panels holds said metal member between itself and said connector housing.

11. The IC card defined in claim 10 wherein an insulating material is applied between said metal member and said one of metal panels so that they are insulated from each other.

12. The IC card defined in claim 10 wherein said insulating material is formed by applying an insulating material to the part of said metal panel that contacts said metal member.

13. The IC card defined in claim 10 wherein said insulating material is at the same time an adhesive that glues said one of metal panels to said metal member.

14. The IC card defined in claim 10 wherein said insulating material is double-sided adhesive tape made from an insulating material.

* * * * *